United States Patent [19]

Springer

[11] Patent Number: 5,640,155
[45] Date of Patent: Jun. 17, 1997

[54] METER CRADLE WITH WIRELESS COMMUNICATION PORT

[75] Inventor: Charles T. Springer, Gig Harbor, Wash.

[73] Assignee: O'Connor Springer, Palo Alto, Calif.

[21] Appl. No.: 837,288

[22] Filed: Feb. 18, 1992

[51] Int. Cl.$^6$ .................................................. G08C 17/00
[52] U.S. Cl. .................... 340/870.28; 324/156; 324/157; 73/431; 359/171
[58] Field of Search .................... 340/870.02, 870.28, 340/870.29; 359/144, 168, 171; 455/41; 346/14 MR; 324/96, 115, 156, 157; 73/DIG. 11, 431; 385/901; 362/32; 364/481, 483

[56] References Cited

U.S. PATENT DOCUMENTS

| | | | |
|---|---|---|---|
| 4,128,859 | 12/1978 | Rietmüller | 362/32 |
| 4,584,527 | 4/1986 | Amigo | 340/870.02 |
| 4,623,869 | 11/1986 | Marubashi | 359/144 |
| 4,739,328 | 4/1988 | Koelle et al. | 342/44 |
| 4,839,854 | 6/1989 | Sakami et al. | 346/14 MR |
| 4,868,893 | 9/1989 | Hammond | 340/870.02 |
| 5,054,112 | 10/1991 | Ike | 455/41 |
| 5,161,874 | 11/1992 | Benes | 362/32 |
| 5,206,097 | 4/1993 | Burns et al. | 429/90 |

OTHER PUBLICATIONS

Owner's Guide and Warranty, for VideoConcepts product, by American Home Video Corporation, two–page excerpt (believed to have been published as of Aug. 1984), and four photographs of said VideoConcepts product (which product bears the date Aug. 1984).

Handheld, battery–powered units combine 50–MHz bandwidht DSO with DMM, EDN Editor's Choice, Sep. 2, 1991, p. 115.
Travtech ADCM–48 A/D and Control I/O described in an advertisement entitled HP 48SX Scientific Expan.

Primary Examiner—Michael Horabik
Attorney, Agent, or Firm—Limbach & Limbach L.L.P.

[57] ABSTRACT

A cradle apparatus (18 or 42) including a wireless interface for communicating via signal-transporting radiation (such as infrared radiation modulated so as to transmit data and control signals) with one or more meters (12) such as portable, hand-holdable, battery-powered multimeters, or other portable meters, mounted to the cradle apparatus, and a meter (12) which transmits signal-transporting radiation to the wireless interface when the meter is removably mounted to the cradle. Some embodiments, include a cradle having a wireless interface, a meter which transmits signal-transporting radiation to the wireless interface when the meter is removably mounted to the cradle, and a processor (48) for receiving from the cradle electrical signals indicative of data transmitted from the meter. Optionally, the wireless interface of the cradle also supplies visible radiation to a meter mounted to the cradle, for illuminating a display (14) of the meter. In a class of embodiments, the cradle includes a pocket-like constraint (22) for constraining a meter in a position in which a transmitter (or transmitter/receiver port) of the meter (40) is aligned with a receiver (or receiver/transmitter port) of the cradle's wireless interface (20). Alternatively, the cradle (42) can have a clasp-like shape, so that the cradle can be clasped onto the meter in a position in which a transmitter (or transmitter/receiver port) of the meter is aligned with a receiver (or receiver/transmitter port) of the cradle's wireless interface.

49 Claims, 5 Drawing Sheets

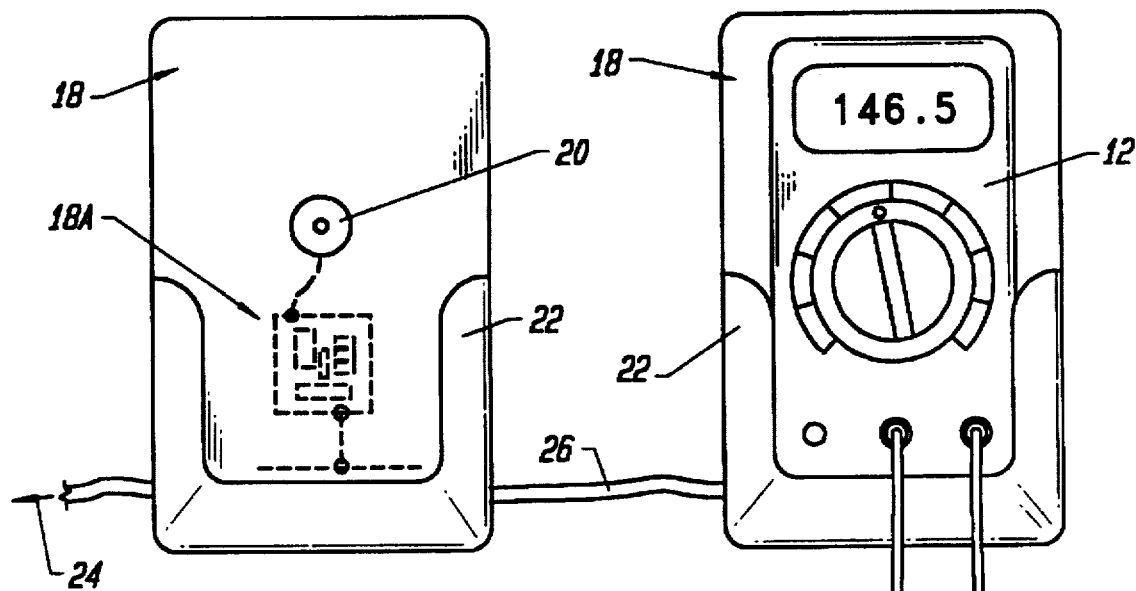
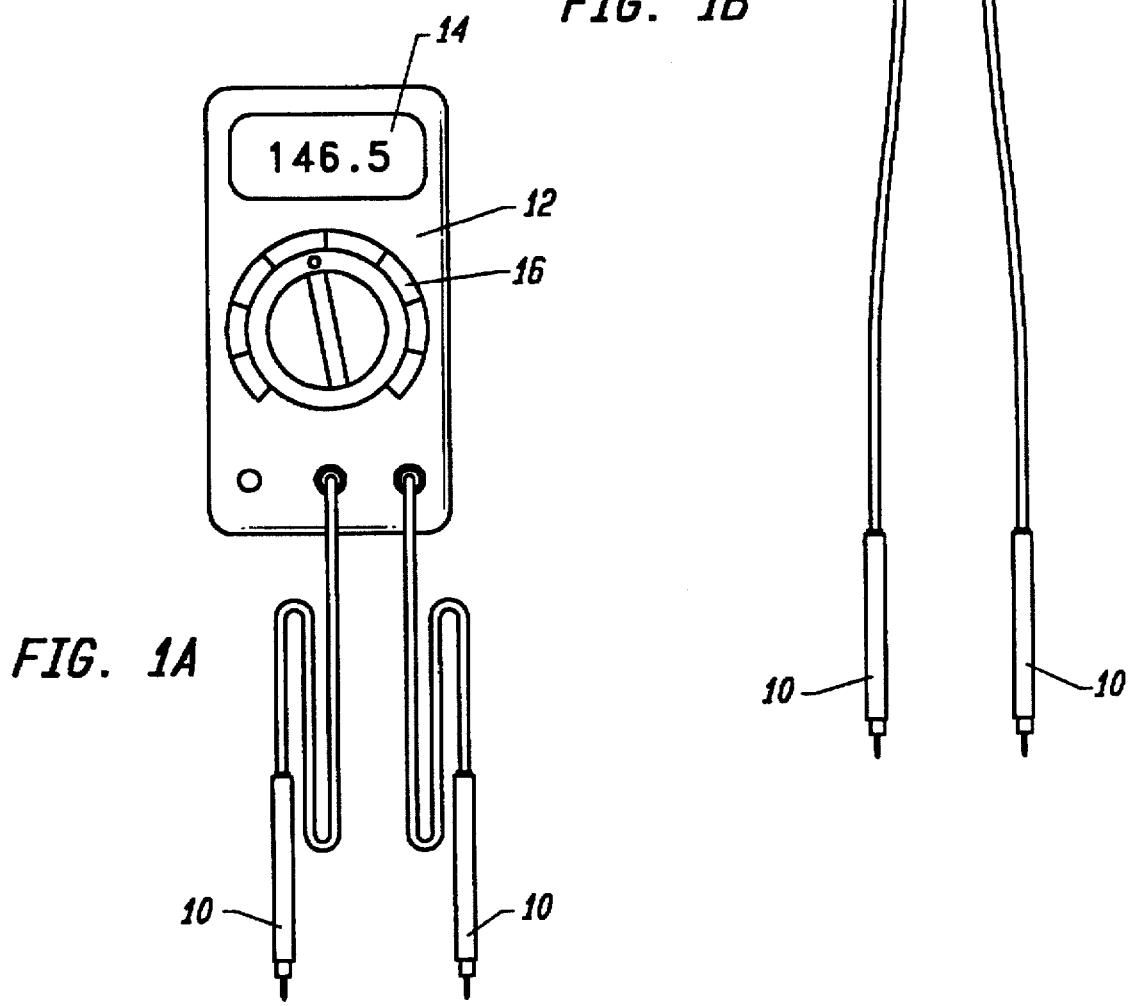
FIG. 1A
FIG. 1B

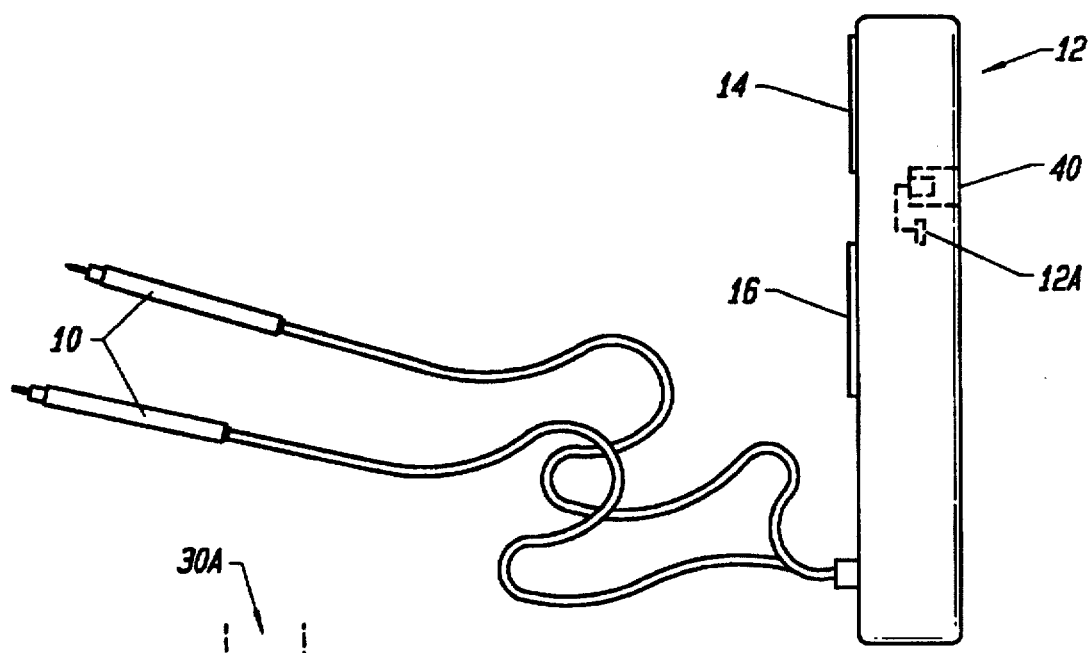
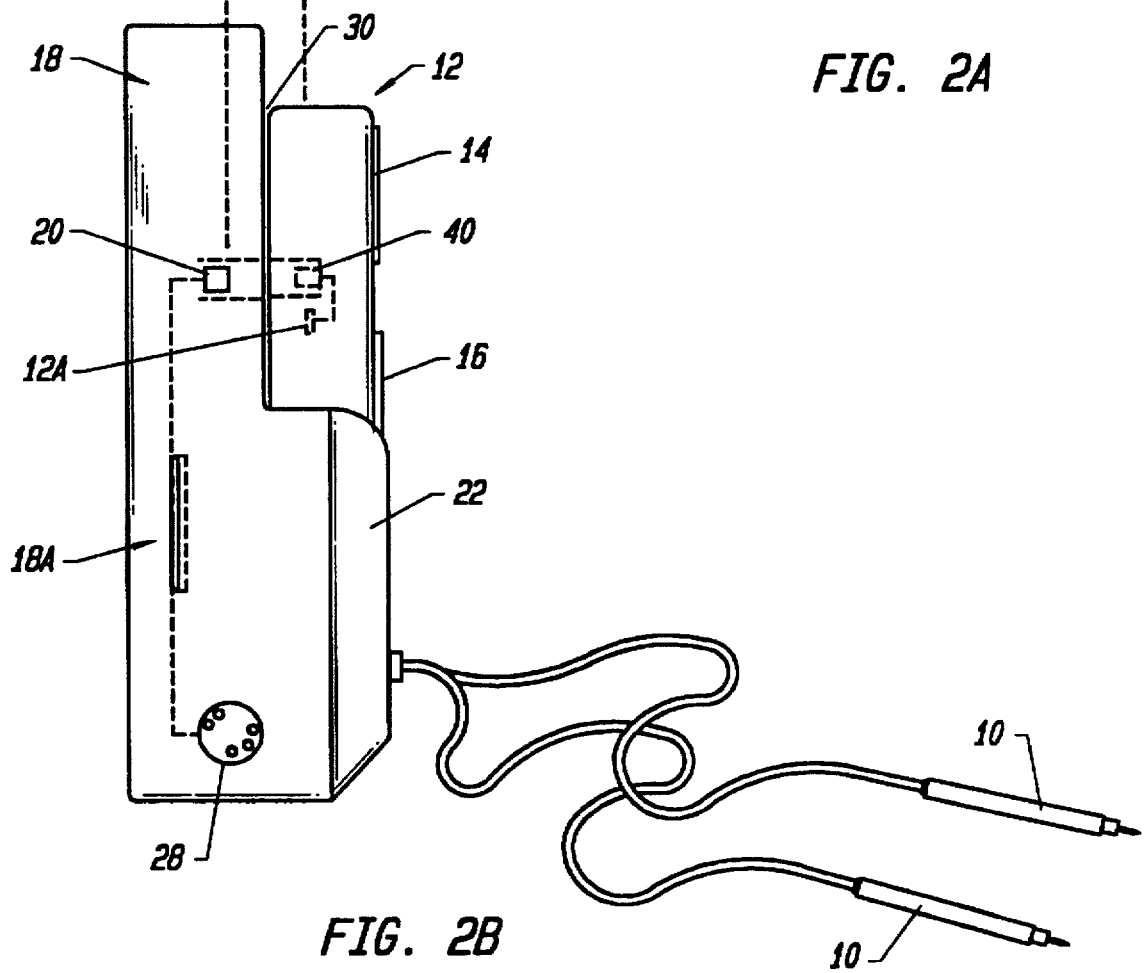
FIG. 2A
FIG. 2B

METER CRADLE WITH WIRELESS COMMUNICATION PORT

FIELD OF THE INVENTION

The invention pertains to a cradle apparatus including a wireless interface means for communicating with a meter. More particularly, the invention pertains to a cradle apparatus including a wireless interface means for facilitating the exchange of data and control signals between a meter (such as a portable, battery-powered electronic meter) and a data recording apparatus or processor (such as a desktop or portable computer).

BACKGROUND OF THE INVENTION

Throughout this disclosure, including in the claims, the expressions "processor" and "means for processing" are employed to denote devices within the broad class of data recording apparatus, data processing apparatus, and apparatus for providing control signals to a peripheral device (such as a sensor apparatus). Examples of "processors" of this type include desktop computers, networks of computers, and devices such as printers, magnetic disk storage devices, and digital electronic memory banks. The invention provides a wireless interface between a sensor apparatus (such as a multimeter for performing electrical measurements) and one or more "processors."

Throughout this disclosure, including in the claims, the expression "meter" is employed to denote any device which directly measures or monitors electrical parameters such as voltage or current, or any measuring or monitoring device which includes one or more transducers (or sensors) for converting physical quantities into electrical parameters (for subsequent processing).

Also throughout this disclosure, including in the claims, the phrases "transmit radiation" and "transmission of radiation" are used in a broad sense, to denote original transmission of radiation from an emitter, and also modulation of previously emitted radiation. For example, "transmission of radiation" is used to denote modulation of a radiation beam (to generate a modulated beam which transmits encoded data). Also, the words "signal" and "signals" are used throughout this disclosure (including in the claims) to denote not only data and representations of magnitudes, but also representations of control parameters such as range and function settings and instructions.

Throughout science and industry there is a perpetual need to sample, record, and process data on the magnitudes of various physical quantities, such as voltages, temperatures, pressures, currents, magnetic fields, light intensities, acidities, and so on. The quantities of interest may be interdependent, they may vary with time, or they may differ instead from one unit under test to another. If the quantity to be metered is not a voltage, then a sensor or transducer (such as a thermocouple) converts the magnitude into an electronic signal (typically an analog voltage) which represents the quantity. It is these electronic signals (analog voltages) which are acquired as data, through the use of instruments such as voltage meters, multimeters, instrumentation amplifiers, analog-to-digital acquisition devices, and the like.

As their name implies, multimeters are capable of measuring several electronic quantities: voltages, resistances, capacitances, currents, frequencies, etc. They are usually hand-holdable, battery-powered devices and are often used with test leads (wires that terminate in probes which are touched to or temporarily clipped to the source which is under test).

Multimeters are often used by technicians who are diagnosing problems in pieces of equipment which are defective. Under these circumstances the multimeter's probes may be accidentally touched to very high voltages—either because the equipment is defective in such a way as to cause junctions which are normally at low voltages to be instead at very high voltages, or, because the technician simply makes an error in analyzing a rather unfamiliar circuit.

Typically, conventional meters (including multimeters) have displays which exhibit the current value of the reading; some can even temporarily store the measured values. Conventional multimeters are "handy" (in the sense that they fit in the hand), are powered by batteries, and their various functions and ranges are selected by one or more dials or switches on a front panel.

The displays are usually liquid crystal displays (LCD's) which work by reflection of ambient light. Some LCD's are backlit, but these consume power and so are not often used on small battery-powered devices, although they have been so used. It is often necessary, in order to read an unlit display, to deliberately orient the meter in such a way as to catch the light. If the meter is being used at a station which has no available surface or mounting for the meter which would allow it to be oriented in the preferred direction, then the operator may need to temporarily hand-hold the meter in order to angle the display toward the light. If it is dark then a flashlight or other external source of illumination may be necessary. In some working environments where it is necessary to avoid such general illumination of the work area, it is difficult to use meters which lack lighted displays.

Most conventional meter displays are digital, and some digital meters or instrumentation amplifiers are equipped with a communications port which allows them to be connected to a computer through a cable. For example, a product available from Exteck Instruments Corporation (of Waltham, Mass.) consists of a digital multimeter which has a built-in RS232 port. When the meter is connected to a computer by a cable to its RS232 port, sampled values of voltage, current, capacitance, resistance, or the like, may be acquired by the computer for storage and processing.

A computer-connected multimeter can be a cost-effective means of gathering statistical process control data on electronic components (i.e., for quality assurance applications). A computer program could be written which would lead an unskilled operator through a series of readings as a circuit board is probed. The program could determine if and where the board is defective and could store the readings for subsequent statistical analysis of failure modes. Complicated and expensive automatic testing equipment is already available for these tasks, but the multimeter-plus-desktop-computer combination offers advantages: because probe contacts are manually made and because the computer is programmable there is flexibility; the cost is low; technical service personnel often have prior familiarity with both multimeters and with the operating systems of desktop computers.

For many years there have been "output" connectors or jacks on many types of meters and 5 instrumentation amplifiers to enable conductive cables or wires to transport the output to recording devices. Recently, output connectors have been provided for supplying digitized data directly to digital computers. In all such digital products which have output connectors for wires or cables, the connector must be supported by internal circuitry which meets some digital communications port specification, such as the "RS232" or "IEEE488" specification, for driving the digital signal down the wire (or cable).

Of course a user of a meter (having an output connector for a wire or cable) may just want to take note of the readings from the display and may never need to connect the output connector to a computer, in which case the connector itself and the associated additional circuitry add cost and bulk to the meter without giving any advantage to the user. A meter manufacturer could offer two models of a meter, one with and one without a communications port, but that course has obvious drawbacks: production is thereby complicated, vendors may not wish to carry a higher-cost model if it is not a big seller, and a user may buy the less expensive meter without the port only to later determine that the port would have been useful.

There are other obvious drawbacks to connecting a multimeter (or other meter) to a processor via a cable. Some of the "handiness" is immediately lost, since the meter is virtually tied down by the cable. Of course the cable can be disconnected and reconnected, but the required connectors for digital communications are typically multi-pin connectors and so care is needed to properly align the connectors when they are reconnected. When repetitive tasks are to be performed, even this minor additional labor is likely to prove to be a significant hinderance.

Moreover, there is the matter of care of the cable when it has been disconnected from the meter but is still connected to the computer. The above-mentioned Exteck Instruments Corporation meter makes use of the very same kind of jack which is found in so-called "modular" telephones. The four pins of the male jack are pressed against the corresponding contacts in the female connector within the meter by a plastic tang which is part of the male jack. The tang is fully exposed and is easily broken off, as when the dangling cable is allowed to rest on the floor and someone steps on it. Of course a more robust type of connector could be used, but there are associated problems of bulk and cost. Stronger connectors which have pins recessed and shielded by a metal band or cylinder are more costly since the construction involves an additional metal part which must be separately fabricated and then joined to the plastic body (whereas modular telephone jacks are of a simple all-plastic, one-piece construction). Furthermore, any connector has some bulk to it, which is undesirable since compactness is among the most desired qualities of hand-holdable meters.

Some types of electronic components (e.g., power-efficient "CMOS" logic devices) are very easily harmed by commonplace levels of static electricity, such as might be transmitted from the user's finger to one of the pins of the jack on the cable as it is connected or disconnected. Thus, some precautions must be taken in order to guard against damage to the active electronic hardware which is used to send and receive the digitized signals to and from the communications port. The available precautions consist of either the addition of protective components or the use of components which are inherently static-resistant but which would presumably otherwise be considered to be second-best (e.g., TTL logic devices are more static-resistant than CMOS but they are also more power-hungry).

It is also possible that the dangling cable could be caught up in moving machinery.

The Fluke Manufacturing Corporation has offered products known as the models 93, 95 and 97 "scopemeters," which are similar, and of which the model 97 has a digital communications port. These products are portable digital storage oscilloscopes and multimeters with liquid crystal displays. The model 97 has an optical port. To use the port, it is necessary to attach a cable which contains an optical-to-electrical converter to the scopemeter.

Optical isolation (e.g., optical isolation of output terminals from the rest of the internal circuitry as in the Fluke Corporation model 97 scopemeter) would be a highly desirable feature for a multimeter which could be connected to a computer, especially if it could be provided for little cost. Consider, for example, the case that the basic requirement is to measure a small difference between two rather large voltages (where both voltages are well above "ground"). If in this case the voltage drop to be measured has a "dc" component or is of low frequency, then capacitive coupling of the inputs would not suffice. Suppose that the input probes of the multimeter are affixed to two junctions on some source under test which are both at elevated voltages (i.e., they are elevated above "ground") and the "low" voltage pin on the cable from the computer is, by design or necessity, at ground. Of course the desired reading is the voltage across the input terminals, the difference between the two elevated voltages. However, if one of the output terminals is grounded by the connection to the computer, and is not electrically isolated from the internal circuitry which measures the voltage difference across the input terminals, then the meter reading may be incorrect.

The characteristic of a meter which has internal circuitry to overcome this problem is usually called "common-mode rejection", the minimization of the effect of the component of the voltages on the input terminals which is common to both terminals upon the reading. If a "direct-coupled" meter lacking optical coupling has internal circuitry which provides for a substantial measure of common-mode rejection, the rejection capabilities will be limited. For example, if one of its output terminals is grounded then the meter reading will be erroneous if the component of the voltage which is common to both terminals is higher than the voltage of the meter's batteries (in effect, the common-mode rejection feature of the circuitry uses the meter's batteries to "buck-out" the common-mode voltage). Optical coupling would break the circuit between the input terminals and the output terminals, and so would enable almost any common-mode voltage to be rejected because there would be no grounding, so the common-mode voltage would not be not applied to the circuitry.

However, at very high common-mode voltages even monitoring instruments with internal optical coupling can fail, as when the common-mode voltage is so high as to cause a spark to jump across the internal optical coupling device. Thus, a scopemeter with internal optical coupling is limited by the breakdown voltage of its internal optical coupling device to an operating range which does not extend to very high source voltages. A greater degree of electrical isolation than is provided by an internally optically-coupled meter would therefore be desirable, particularly for a multimeter, because connecting a multimeter (or other meter) to a computer through an optical-coupling link which could break down would create the risk that a computer operator (who of course does not expect to encounter the risk of high voltages at the computer) could be shocked. Voltages insufficient to injure the computer operator could nonetheless cause extensive damage to computer circuitry, or loss of data, or both. An important advantage of the present invention is to avoid the exposure to such risks, thereby entirely escaping the attendant product liability, risk control, and regulatory burdens.

Optical coupling also eliminates ground loops. When a voltage source under test is connected to a meter (which measures and/or records data) through wires or cables, and the meter circuitry is not isolated from ground (as by an optically-coupled link), then there are two kinds of paths between the source under test and the meter: the intended paths through the wires or cables; and "ground" paths (through desktops, floors, the earth, or plumbing in the walls, to name some examples). The ground paths and the wires or cables form closed "ground loops".

According to Faraday's law of electromagnetism, a time-varying magnetic field through a ground loop (such time-varying magnetic fields are generated by radio signals and by alternating current in power mains) generates a voltage drop around the loop. Some fraction of the voltage drop appears along the lengths of the wires or cables, because they have non-zero resistances. This voltage drop is sensed by the measuring or recording device as a spurious signal superimposed upon the "true" voltage difference to be measured.

An optical link would break such ground loops. When a ground loop is broken, no current is induced therein, and so no spurious voltage drop appears along the wire or cable (thus preventing transient currents on power lines and radio waves from appearing as spurious signals). There are other ways of reducing the effects of ground loops, such as to enclose the leads in a conductive sheath or to twist the leads together so as to cause the spurious ground loop voltage to be equally present on both leads and hence not evident as a voltage difference between the leads. These are effective measures, but not as effective as use of optical links (which are nearly 100% effective).

There is another way that optical links are used for communications with computers. For several years the Hewlett-Packard Corporation has manufactured and sold "hand-held computers" and calculators which broadcast an infrared beam and which can thereby communicate digitally (via an optical link) with certain peripheral devices. To use the optical link it is necessary deliberately to aim the port of the hand-holdable computer or calculator at the corresponding port of the peripheral device. Most commonly the peripheral device is a printer, but a battery-powered, multi-channel, analog-to-digital converter and input-output control device (model ADCM-48) available from EduCALC Corporation of Laguna Niguel, Calif., has an infrared port for communication with a Hewlett-Packard Corporation hand-held computer. The model ADCM-48 is not a portable "meter" with a display and controls for selecting voltage ranges; it is a box with terminals for analog voltage inputs and digital control inputs and outputs.

With all of these Hewlett-Packard (or Hewlett-Packard-compatible) peripheral devices, in order to use the infrared link one must position the computer or calculator within a foot or two of the peripheral device and aim it in the general direction of the peripheral device. Usually this requirement is met by placing both devices on the same level surface, such as a benchtop, desktop, or floor. If the inter-device distance is too great, then the communication will be garbled or will not occur at all. Of course, the line of sight between the devices cannot be intercepted by any obstacle, as that would block communications.

Such optical links as are found on the Hewlett-Packard or Hewlett-Packard-compatible devices offer the general advantages of optical links which are described above, but the positional use limitations which encumber such links would be severe if they were to be imposed upon many types of meters (such as multimeters). Even if a computer for receiving signals broadcast over such an optical link is hand-holdable, it is undesirable to require always a clear spot on a level surface for the computer just to effect the optical linkage. Furthermore, because this kind of optical link requires aiming of the single port on the computer, it is obviously not adaptable to simultaneous communication with several peripheral devices. Furthermore, with this kind of optical link it is only feasible to transmit data and control signals. It would be advantageous to be able also to transport light over an optical link for the illumination of an LCD display of a peripheral device.

Other conventional "wireless" computer networks work by broadcasting infrared signals between multiple desktop computers and peripheral devices (for example, in open-plan offices). In order to work, they require a continuously open path for the infrared radiation. Furthermore, these networks can transmit only data and control signals, not light for illumination.

Another other class of conventional products uses infrared beams to transmit data and control parameters: remote controls for television sets, videocassette recorders, and audio equipment. Some such systems have interesting and relevant advanced capabilities. For example, at least one such remote controller is "intelligent" in the sense that it can read and "learn" the infrared transmissions of controllers produced by other manufacturers. In this way it can be programmed to be a universal controller for many remote entertainment appliances of different manufacturers (to each it sends appropriately-coded control parameters). This is a capability which is made practical by the very nature of data transmission on a beam of light rather than on a cable: there are no hookup-related hardware incompatibilities (connectors, pin diagrams, voltage levels, etc.) to deal with.

Because the Hewlett-Packard and Hewlett-Packard-compatible devices, and conventional television remote control devices and the like, are portable and communicate with infrared radiation over distances of a foot or more, they use beams which are fanned-out in order to avoid having to point their ports precisely at each other to effect the linkage. The receiving ports are but a fraction of an inch across, and so only a small fraction of the broadcast radiation actually enters the receiving ports and is used to effect the linkage. Thus, because they lack a means for ensuring that most of the radiation from one port reaches another, such devices necessarily waste much of the radiated infrared power. This wastage is tolerable for television channel changes (which are very brief and isolated events) or occasional sessions in which a computer or calculator is linked to a printer, but constant data transmission over such a link would tax the batteries of the portable device.

Until the present invention, it was not known how to eliminate the described disadvantages and limitations of conventional apparatus for coupling a meter with a computer by means of a wireless link.

The present invention provides numerous advantages over the prior art. For example, the invention:
- allows several meters (rather than just one meter) to exchange data and control parameters with a processor (such a computer, computer network, or data recording device);
- provides an extreme degree of electrical isolation between a processor and one or more meters for the complete safety of personnel, data, and equipment, and to reject common-mode voltages and ground-loop noise (this enables the invention to be employed to take measurements in a variety of electrically hostile environments);
- incorporates a wireless (connector-free) communications link within a receptacle or mounting means (station) for a meter, which link is easily and safely broken when the meter is temporarily freed from its station for other use, thus avoiding the mechanical hazards of dangling cables, the need to implement the linkage with static-resistant parts or circuits, and the labor of making and breaking the contacts of a multi-pin connector every time the meter is removed from its station;

provides light for illumination of a meter's display, without drawing on batteries within the meter or using any connection to the meter, thus making the display easy to read in any light and avoiding the need to tip the display toward the available ambient light every time it is read;

causes wireless communication to occur a "point-blank" range, thus making minimal use of power and prolonging the battery life of the meter; and optionally allows wireless communication to occur without the meter being required to generate signal-transporting radiation, thus making minimal use of power and prolonging battery life.

Further advantages of the invention follow from the linkage with computers and other data processing or recording equipment which the invention naturally accommodates. With the invention, meters can be daisy-chained together, thereby enabling nearly simultaneous serial communications between several such meters and a processor (such as a computer, printer, recording apparatus, or computer network). Consequently, the invention allows an otherwise-ordinary multimeter and a desktop or portable computer (having an internal clock) to replace a strip chart recorder, and two multimeters and a computer to replace an "x-y" recorder and display the relationship between two interdependent magnitudes.

This distributed multi-channel capability is different from that offered by analog-to-digital converters which have the multi-channel capability within a single instrument. Signal-level voltages cannot be sent over very long wires or cables unless first amplified in order to overcome electrical noise and the resistances of the wires or cables. Hence, for successful operation, each source of voltages to be measured must be rather close to the inputs of the measuring device. Thus, the multi-channel feature of analog-to-digital converters (such as the above-described model ADCM-48) will not be usable with widely-separated sources of signal-level voltages. In contrast, the multi-channel capability of the invention, allows each linked ("on-line") meter to operate as a channel and to be placed as close to a voltage source (or sources) as necessary. Hence, each voltage source may be at any distance from each other voltage source and from the processor (i.e., at any distance feasible for the operation of the digital network). This is not possible with the ADCM-48 scheme because the infrared beam from the computer must be pointed directly at the ADCM-48 from a nearby location, and the beam can only be pointed in one direction at a time.

The linkage provided by the invention is also immune to spurious interference from other digitally-communicating devices which may afflict other types of data links. For example, conflicts may arise between systems which broadcast infrared radiation around a room if two different systems by two different manufacturers are used at the same time. Some embodiments of the invention have this immunity even if beams of infrared or visible radiation are the means of transmission.

Among the benefits of the invention to a meter manufacturer are many leveraging opportunities. To elaborate on comments made above, the invention requires that only a slight modification or addition be made to a meter in order to make the meter digitally linkable ("network ready"). The cost and effort of incorporating the modification (or addition) would be so small that the meter manufacturer could sell the enhanced product at almost no additional cost to customers who want the linkage capability and to customers who do not. The controller/receiver ("cradle") of the invention, which is the interface between the meter and a processor or which incorporates a processor, could be produced by manufacturers other than the meter manufacturer. Other meter manufacturers could produce meters which use the data and control parameter encoding protocol implemented by the cradle, so that such meters would be compatible with the previously-produced cradle.

There is pre-existing software for data acquisition which would also provide leverage. For example, LabView software, available from National Instruments is designed to work with a variety of data acquisition equipment. It and other software packages already on the market could be modified to accommodate users of the invention, so that meter manufacturers need not develop their own software.

Similarly, the cabling and other hardware which would connect the inventive cradles to processors could be "off the shelf" items which are already available. The invention could be implemented on any of several conventional computer networks or busses. No special transducers or other electronic components are needed to make meters and cradles which implement the invention.

The invention allows meters such as multimeters to be used for new applications. With the inventive cradle and a desktop computer, they can replace strip-chart recorders and x-y plotters. Many older but still-functioning pieces of electronic test equipment have analog outputs (not digital outputs). There are conventional amplifiers of various types with sophisticated inputs for very small signals, and preamplifiers, all with analog outputs. With the invention, voltage meters or multimeters can be attached to such analog outputs, thus converting them to digital outputs, and allowing the output data to be stored, displayed, and analyzed on a computer.

All these possibilities for expanding sales of meters could be captured by a meter manufacturer for just the small expenditure needed to effect the slight modification or addition which makes a meter optically linkable with the inventive cradle.

Throughout the remaining portion of this disclosure, including in the claims, the term "radiation" is employed in a broad sense to denote any type of radiation or field that is capable of being modulated so as to transmit data or other signals across a wireless communication link. Examples of such "radiation" include electromagnetic radiation (such as, but not limited to, visible, infrared, or ultraviolet radiation), acoustic radiation, the field surrounding a capacitive or inductive coupling device, and the near field of an acoustic source.

SUMMARY OF THE INVENTION

The invention is an apparatus (identified herein as a "cradle") including a wireless interface means for communicating by means of radiation (such as infrared radiation modulated so as to transmit encoded data and control signals) with one or more meters (such as portable, hand-holdable, battery-powered multimeters or other portable meters). In another embodiment, the invention is a meter including means for presenting signal-transporting radiation (i.e., radiation modulated so as to transmit data or other signals) to a wireless interface means of a cradle to which the meter is removably mounted.

Optionally, the wireless interface means of the cradle also supplies visible radiation to at least one meter mounted in the cradle, for illuminating at least one meter display. In a class of embodiments, the invention includes a cradle having a wireless interface means, and also a meter including means for transmitting signal-transporting radiation to the wireless interface means when the meter is removably mounted to the cradle.

In a class of embodiments, the cradle includes a pocket-like constraint portion, for constraining a meter in a position in which a transmitter (or transmitter/receiver port) of the meter is aligned with a receiver (or receiver/transmitter port) of the cradle's wireless interface means. Alternatively, the cradle can have a clasp-like shape, so that the cradle can be clasped onto the meter in a position in which a transmitter (or transmitter/receiver port) of the meter is aligned with a receiver (or receiver/transmitter port) of the cradle's wireless interface means. In other embodiments, the cradle is a carrying case (which can be made of cloth, leather, vinyl, or some other flexible material) which can constrains the meter in a position in which a transmitter (or transmitter/receiver port) of the meter is aligned with a receiver (or receiver/ transmitter port) of a wireless interface means within the cradle.

In any of its embodiments, the cradle can include a power supply (such as batteries) and a digital memory, so that it can log data received from the meter via the wireless link of the invention.

BRIEF DESCRIPTION OF THE DRAWINGS

FIG. 1A is a simplified elevational view of a meter, of the type which can be removably mounted in the inventive cradle.

FIG. 1B is an elevational view of two cradles embodying a preferred implementation of the invention. The cradles are connected together in daisy-chain fashion, and a meter rests in the cradle on the right. Because the cradle on the left is empty, its signal port is visible.

FIG. 2A is a side elevational view of the meter of FIG. 1A.

FIG. 2B is a side view of the meter of FIG. 2A mounted in a cradle of the type depicted on FIG. 1B.

Reference Numerals in Drawings

Figures 3A, 3B:
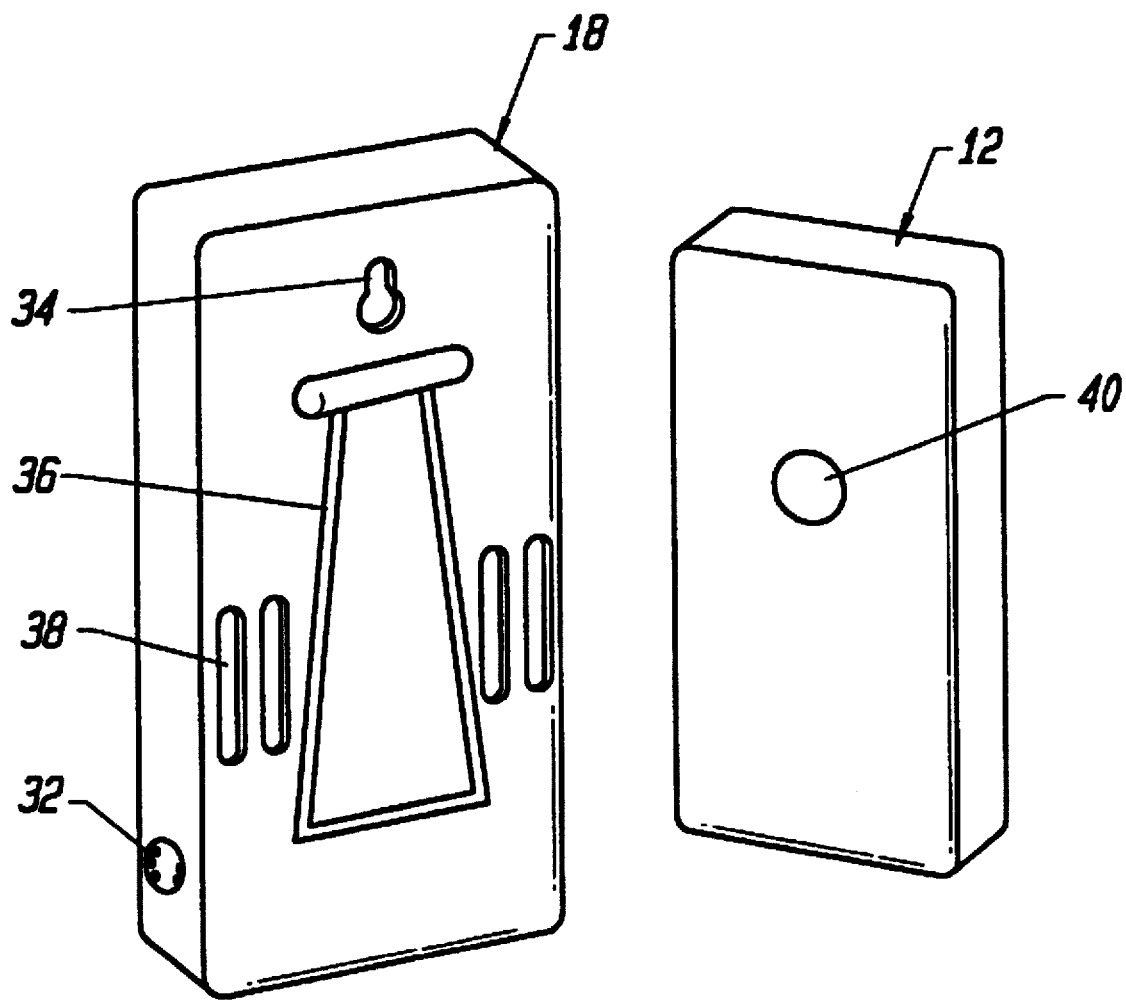
FIG. 3A is a rear perspective view of the cradle of FIG. 2B.
FIG. 3B is a rear perspective view of the meter of FIG. 2A, showing signal port 40 thereof.

10—meter test leads;
12—body of portable meter;
12'—body of alternative embodiment of portable meter;
12a—electronic circuit for generating signals representing meter readings and/or range and function settings or other control parameters, and asserting the signals to electronic components of signal port 40 (for modulating signal-transporting radiation which then propagates away from port 40 to port 20), and for processing control signals received from port 40 and asserting the processed control signals at display 14 (or as range or function settings);
14—meter display;
16—rotary front panel range (and function) switch;
18—body of cradle (containing electronics);
18a—electronic circuit for generating electrical signals representing encoded data received at port 20 from a meter and storing these electrical signals or asserting them to cable 24, for relaying electrical signals from cable 26 to cable 24, and for processing control signals received from cable 24 and asserted the processed control signals to one or both of port 20 and cable 26;
18'—body of cradle (containing electronics 18a, signal port 20, and illuminating radiation source 20d);
20—signal port of cradle;
20a—lamp;
20b—visible radiation emitted by lamp 20a;
20c—port (in meter 12) for receiving illuminating radiation from cradle 18;
20d—source (in cradle 18) of illuminating radiation;
22—constraints dimensioned for holding meter in cradle;
24—cable connecting cradle circuit 18a with data recording and processing equipment;
26—cable which connects two cradles together;
28—first electrical connector built into body of cradle;
30—gap between meter and cradle;
30a—gap between the electronic components of signal ports 20 and 40;
32—second electrical connector built into body of cradle;
34—elongated opening for hanging cradle on nail or the like;
36—pivoting bail for propping up meter;
38—guides for strap to fasten cradle to station;
40—signal port of meter;
40a—internal pathway within meter 12, for guiding illuminating radiation from port 20c to meter display
42—body of "clasp" type cradle;
44—electrical connector in body of cradle 42; and
48—laptop computer.

DESCRIPTION OF THE PREFERRED EMBODIMENTS

Each controller/receiver cradle 18 shown in FIG. 1B contains electronic circuitry 18a which transmits and receives data and control parameters to and from meter 12 (such as that shown in FIG. 1A and 1B) when meter 12 is positioned within pocket-like constraint portion 22 of cradle 18. Electronic circuitry 18a can be mounted within cradle 18 (as indicated in FIG. 1B) or alternatively in a small chassis box attached to cradle 18. Electronic circuitry 18a also manages communications with a processor (not shown in FIG. 1B) connected to an end of cable 24.

In each embodiment of the invention, constraints (such as constraint portion 22), or the force of gravity, or both, maintain meter 12 temporarily in position in a cradle (i.e., cradle 18) but not necessarily fastened well to the cradle.

As shown in FIG. 2B, when meter 12 is removably mounted in cradle 18 (such as by being inserted within constraint portion 22 of cradle 18), a small gap 30 may naturally appear between the body of meter 12 and the body of cradle 18. A greater gap 30a separates the electronic components of signal port 40 (within meter 12) and the electronic components of signal port 20 (within cradle 18). In the preferred embodiment of FIGS. 1B and 2B, a digital linkage (a "wireless" linkage, sometimes referred to herein as an "optical" linkage) is effected across gap 30a via modulation of a radiation beam (or beams) which pass between signal ports 20 and 40 (either from port 40 to port 20, from port 20 to port 40, or from a first one of the ports to a second one of the ports and back again, after undergoing modulation upon reflection at the second one of the ports). Each radiation beam can consist of visible radiation, infrared radiation, ultraviolet radiation, acoustic radiation, or other types of radiation. The term "radiation beam" is employed herein in a very broad sense, including, for example, even the field surrounding a capacitive or inductive coupling device (for example, in implementations in which signal ports 20 and 40 are spatially separated but capacitively or inductively coupled, such as where ports 20 and 40 are electrical coils separated by air or another insulating material).

Gap 30a can be about one-fourth to three-fourths of an inch in size, in embodiments in which modulated infrared radiation is transmitted across it.

Ultrasonic transducers, capacitive-coupling, or inductive-coupling devices can be used to implement the wireless linkage of the invention. Of course the ports comprising the wireless linkage need not be situated at the locations shown on the figures.

As shown in FIGS. 2A and 2B, meter 12 includes electronic circuit 12a, for generating electric signals representing meter readings and/or range and function settings or other control parameters, and asserting the signals to signal port 40 for modulating signal-transporting radiation which then propagates away from port 40 to port 20. In response to these electric signals, port 40 can either generate an original data-transporting beam, or can modulate an incident beam from port 20 upon reflection of such incident beam at port 40. Circuit 12a is also capable of processing control signals received from port 40 and asserting the processed control signals to display 14 (or otherwise asserting the processed signals as range or function settings to other means within meter 12.

In embodiments in which signal port 40 generates and transmits an original beam, such original beam need have only very low power and narrow beam width (unlike conventional infrared beams of the type emitted from conventional remote control devices and the like). The power required to generate such original beam should be less than that which would significantly impact the life of batteries mounted in the meter. Preferably the original beam radiates more than half its power within a cone which has a half angle of no more than ten degrees (where such half angle is half the angle subtended by a line drawn between the receiving device, i.e., port 20, and the point source, i.e., port 40).

In a preferred embodiment in which signal port 40 generates and transmits an original beam, meter 12 has no mode of operation in which it radiates power in excess of 10 milliwatts, on a time-averaged basis.

Figure 5:
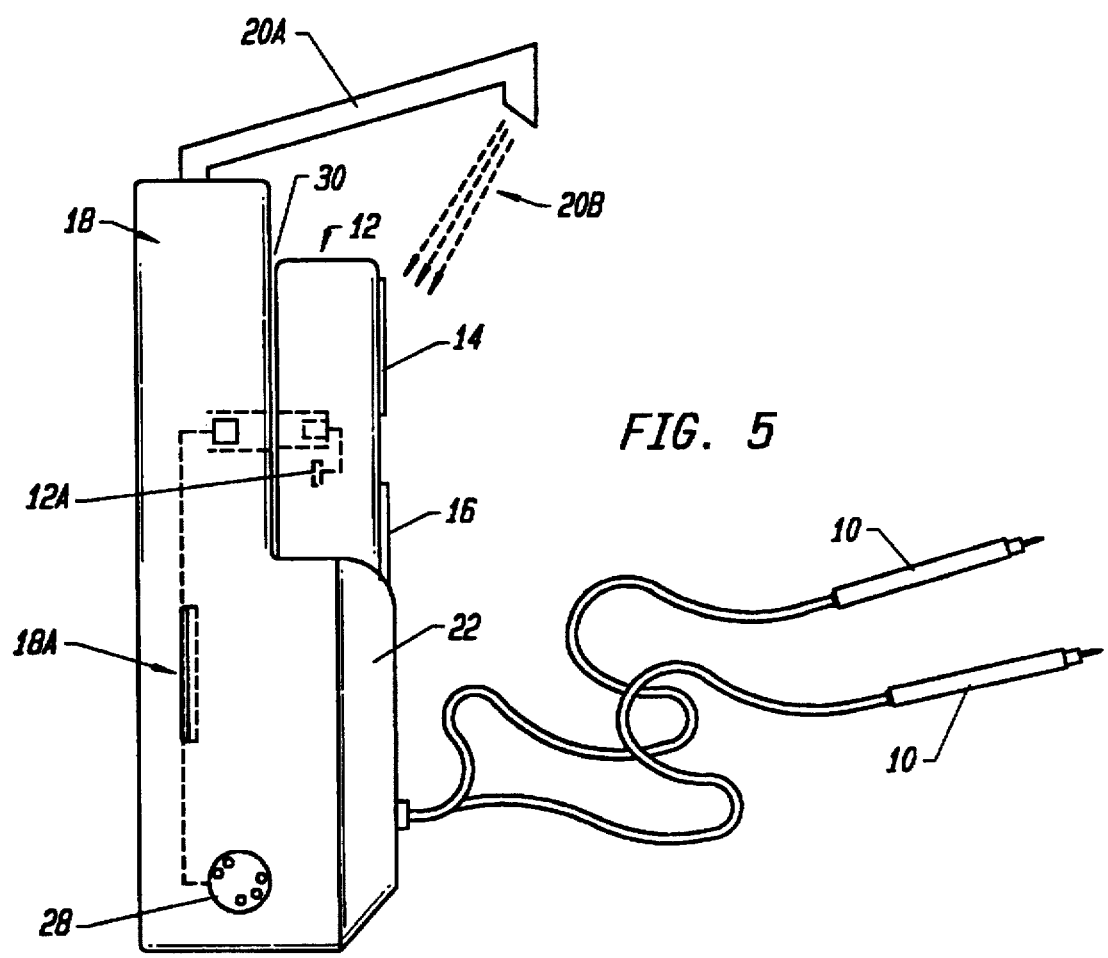
FIG. 5 is a side view of a meter mounted in a cradle having a protruding lamp for illuminating the meter's display.

In some implementations, cradle 18 contains within it a light source which projects a beam of visible light (through port 20 or through a separate optical port) into a corresponding port (such as port 40) in the back of the meter. This visible light can be channelled within the meter to its display 14, via a light pipe, mirrors, or optical fibers, for the illumination of the display. Alternatively, the cradle may be configured to incorporate a task lamp (such as lamp 20a shown in FIG. 5) which directs light 20b onto display 14 of meter 12 from the outside of meter 12. The latter alternative embodiment does not provide display-illuminating light from a concealed optical port and it therefore has limitations, including the following: there would be stray light which might interfere with certain types of experiments, and the lamp would protrude from the cradle.

There are no conductive connections of any kind between meter 12 and controller/receiver 18 (i.e., no wires or cables or metal pins). Generally speaking, there are no strict or specific materials requirements for the body of cradle 18 or for meter 12: both could be made of plastic, for example. Cradle 18 could even take the form of a soft case, like a carrying case but with an opening for exposing the front panel of the meter to the operator. The cables and connectors 26, 28, 32 and 44 (FIGS. 1B, 2B, 3A and 4) for linking the cradles together (and linking at least one of the cradles to the processor) in a multi-station setup, could be of the stock variety, as there are no special electronic requirements.

The invention requires no electronic circuits or devices within the meter for the purpose of driving digitally encoded signals down cables or wires (such as cable 26), and no output connectors are required on the meter. Instead, these elements are within (or attached to) cradle 18. Hence meter 12 of FIGS. 1A, 2A, 3B and 4 is properly illustrated as having a clean, slim shape.

Figure 4:
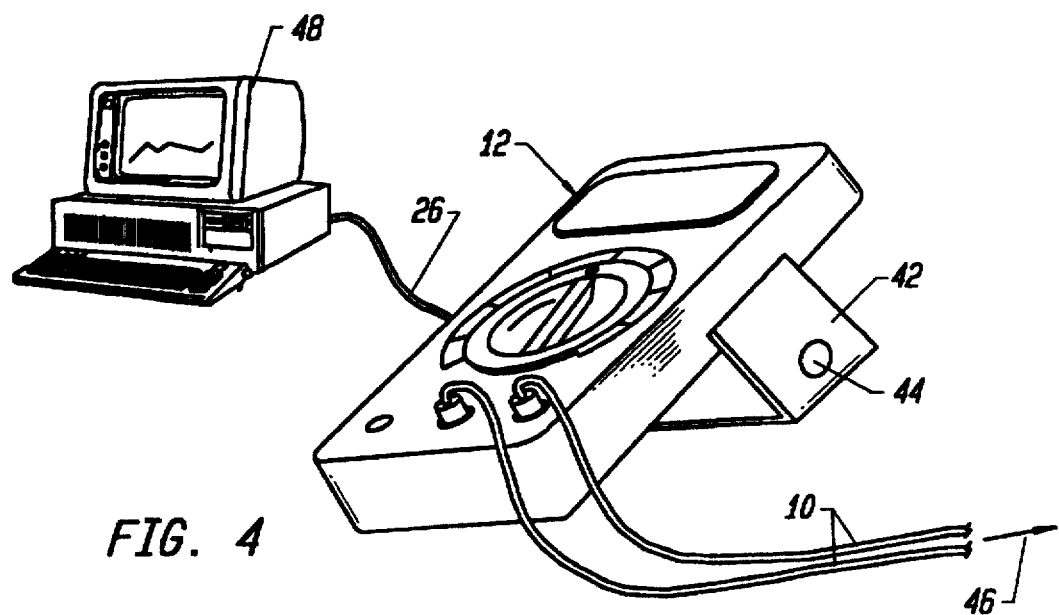
FIG. 4 is a perspective view of a meter removably mounted in, and supported by, a diminutive version of the inventive cradle. The cradle is connected by a cable to a processor, and is clasped onto to the back side of the meter in such a way as to prop up the meter.

FIG. 4 illustrates a second embodiment of the inventive cradle. Cradle 42 of FIG. 4 is smaller than cradle 18 of FIG. 1B, but like cradle 18, serves a mechanical function in addition to its electronic function (cradle 42 props up meter 12 so that its display 14 is at a convenient angle. Cradle 42 is clasped onto the back of meter 12 at the meter's signal port (not shown in FIG. 4), but is otherwise like cradle 18 of FIGS. 1B, 2B and 3A.

Not illustrated are feasible implementations in which two or more cradles (each for supporting one or more meters) are fused together into one body. It should be appreciated that in variations on any of the above-described embodiments, the cradle can be made of rigid material (such as plastic) or flexible material (such as cloth, leather, or vinyl).

When a meter which embodies the invention (e.g., meter 12) is not inserted in its cradle 18 (or 42), it is operated in exactly the same manner as any otherwise comparable meter which does not embody the invention.

The first step in utilization of the invention can simply be to acquire only part of an automated measurement system which incorporates the invention (i.e., just a meter which implements the invention for use as a hand-held meter). This preserves the option of later linking the meter to data processing and recording equipment (using the inventive cradle), when use of the meter suggests that an automated method of data collection would be beneficial.

This cost-conservative stratagem by a user would be feasible with meters in present use which have RS232 ports. However, the invention makes the strategy more feasible. This is because a meter which embodies the invention need contain only one additional electronic element beyond those which it would have if it lacked the capability of being optically linked to a processor (e.g., an infrared diode, or other source of signal-transporting radiation). In contrast, conventional meters which have optically coupled RS232 serial ports (for use with electrical connectors) include circuitry for driving signals from each RS232 port down an electrical connector, and thus obviously must include complicated (and costly) additional electronic elements to implement each such optically-coupled RS232 serial port (including the associated driving circuitry).

The invention makes it feasible for manufacturers to give the functionality of linkability to data processing and/or recording equipment to their meters for but slight additional costs. Hence, it is anticipated that only a minority of users of meters which embody the invention will acquire (and bear the cost of) the inventive controller/receiver cradle (which incorporates connectors and circuitry for driving signals down cables). Even if some meter users ultimately never acquire the other components of an automated measurement system (including both a meter and a cradle) which embodies the invention, the invention will have been used to encourage sales of meters which embody it.

A meter embodying the invention which is later to be used with a controller/receiver cradle can of course be used in a conventional fashion: the various functions of the meter are employed in a "hands-on" manner to assess the state of equipment under test, in order to get immediate feedback from the display 14 about quantities which can later be recorded and processed as digitized data with the use of the controller/receiver cradle.

These manually implemented ("setting up") tasks are all ones which might typically be done with a hand-held meter of some sort prior to using any automated digital data acquisition system. However, with the invention, instead of then rolling out an entirely different piece of electronic equipment with an entirely different input stage, one which has not yet been tested on the equipment which is to be monitored (one which may be grounded differently, which may not have the same range capability, which may not be optically coupled and so may create ground loops), a user of the invention wishing to record readings merely places the body of the meter in a cradle (or, in the implementation shown in FIG. 4, clasps the cradle onto the meter). Appropriate computer software in a processor connected to the cradle is then "launched" (for example, the processor can be a data recording device such as a printer, and the software can be launched by merely turning on the data recording device).

If there is a need for the cable between the cradle and the processor to be mechanically secured (e.g., to prevent the cable and cradle from falling into moving machinery) the operator may first affix the cradle to the apparatus which is under test or to a nearby wall so as to set up a station for the meter- effecting the attachment with some appurtenance (34 or 38) which is provided on the body of cradle 18 (as shown in FIG. 3A) for that purpose. The cable to the cradle may then be tied up very securely, without causing any inconvenience when the operator removes the meter from the cradle and replaces it because there are no physical connections to be made to the meter. That is, the operator need not make and remake a multi-pin connection every time the meter is removed from the station and replaced—a task which could not be conveniently done with meters in present use which make use of output connectors without there being some considerable amount of slack in an attached cable.

Because the invention incorporates optical coupling (or another form of wireless coupling, such as one of those mentioned above) the meter operator need not be concerned about common-mode voltages on the source affecting the readings. Such a concern would naturally arise if the output stage of a meter had to be connected by conductive wires or cables to data recording or processing equipment. With the inventive apparatus, the terminals to which the two test leads are touched or attached may be at very elevated voltages, as long as the difference between the voltages does not exceed the maximum range of the meter. Hence in operation the user will merely determine if the voltage difference to be monitored exceeds the range of operation of the meter; no investigation of common mode voltages will be necessary.

Within very broad limits, the meter operator also need not be concerned about high voltages shorting across the optical linkage and causing damage to sensitive data processing and recording equipment or shocking the computer operator. This is because the coupling which the invention offers is across an external gap 30a between two instrument bodies 12 and 18 rather than within the confines of one, so that an extreme amount of electrical isolation is provided. The operator may therefore leave a meter which embodies the invention in its cradle while probing equipment which has electrical parts under very high-tension, whereas it would be prudent to disconnect meters with communications ports of the type which are in present use before making such a test.

The operator need not be concerned that linking the meter to a processor will create ground loops which introduce noise, for with the invention the means of coupling very clearly breaks ground loops. The operator would therefore usually be free to use test leads which do not form twisted pairs, that are not coaxial, and which are reasonably long (conditions which would ordinarily exacerbate ground loop effects).

It is anticipated that various degrees of electronic complexity and functionality will be realized in products which embody the invention. A particularly simple implementation might just link a single meter with a computer through an RS232 serial port of the computer and provide one-way transmission of meter display readings (data) and dial settings (control parameters) to the computer. Such a system might perhaps appear like the equipment which is shown on FIG. 4 (although FIG. 4 could also pertain to a system providing two-way communication between meter and computer). With simple one-way hardware a popular mode of operation would likely be one in which the meter would simply broadcast its display reading and function setting each time the display is updated. This mode would be particularly useful for emulating a strip chart recorder. Alternatively, data and control parameters could also be sent when a button on the meter is depressed.

Various schemes could be used to digitally encode the communication between the meter and the controller/ receiver cradle. For example, the sequence could consist of an ASCII-encoded field for the measured quantity, then a field-delineator character, then a field for a control parameter representing the function and range settings, and finally, another field-delineator character. This sequence would be repeated once for each additional reading. (Many such communication protocols already exist for such purposes and many others could be established. No single or particular protocol is a necessary or preferred element of any implementation of the invention, for many could work as well as the simple one just described.)

Greater functionality could be won by putting switches in the handle of one of the test lead probes and assigning control parameters to the switch settings. These too would be transmitted through the signal port, for the settings of the switches would of course be electronically identical (in character) to those of the rotary switch on the front panel of the meter. In this manner an operator could, by clicking the appropriate switch in the test lead handle, skip through certain steps of a pre-programmed diagnostic test or backspace to repeat measurements—controlling the computer program in the manner of an accountant using a computer mouse to maneuver around a spreadsheet, but without having to touch the computer. If the means are provided whereby the operator does not have to touch the computer to record readings while the probes of the meter are being manually touched to the equipment under test, then the electrical isolation of the computer from the equipment under test is further enhanced.

In embodiments of the invention including means for two-way communications between the cradle and the meter, a remote computer (connected to the cradle) could control the meter's range and function settings. This would sometimes be useful for pre-programmed diagnostic tests. During such tests the computer could display captured images of the electrical parts of the units under test along with indications which prompt for the probing of the next junction in a pre-programmed sequence or in a sequence which is determined by the computer after it has performed an analysis of the prior readings. This could be used for the testing of printed circuit boards or automobile electrical systems (as there are automotive multimeters).

The computer could be programmed to send to the meter's display an indication of what a particular programmed reading should be, so that the operator could make a ready comparison with the actual reading (which could of course also appear on the meter's display) without the operator having to consult the computer screen.

Two-way communications would also allow the computer to poll for readings. This functionality would help ensure that readings from several meters (mounted in the same or different cradles) would arrive at the computer at appropriate times, as when for purposes of comparison it is desirable to ensure the near-simultaneity of readings taken on two different meters. Polling would be useful to minimize the drain on the meter's batteries caused by the signal port itself. Each meter could also have a "wake-up mode", so that when the requisite interval between readings is lengthy most of the meter's circuitry could be normally turned off, and activated for each reading for only as long as necessary to take the reading.

The operator who wishes to record two quantities nearly simultaneously (so as to make an "x-y plot" of them) could use two meters, each in its own cradle. The two readings would be distinguishable from each other because each controller/receiver cradle would assert (at its connectors 28 and 32) its serial number along with data (display readings) and control parameters (function and range settings) from the meter which it monitors. The serial number could either be fixed by the manufacturer as part of the internal electronics of the controller/receiver cradle, or, the operator could select a suitable distinguishing number for each controller/receiver cradle by setting switches on or within the cradle body (i.e., cradle body 18).

The simultaneous use of two or more controller/receiver cradles would require that each have more sophisticated electronic circuitry than would be needed for communications involving just one controller/receiver cradle. Whereas communication between just one controller/receiver cradle and a processor could occur via an RS232 serial port in the processor and a similar port in the cradle, communication between several controller/receiver cradles and a processor would be conducted with network hardware and network communications protocols which allow several devices which are the "nodes" of a network to communicate on the network, one at a time. Since transmissions on such networks are very rapid, readings from two meters could be sent nearly simultaneously. To make such measurements the operator would merely "daisy-chain" two or more network-capable cradles (18 or 42) together (in the manner illustrated on FIG. 1B but with a meter in each cradle). One meter would monitor the "x-axis" quantity and another the "y-axis" quantity.

The network could be one in which each node or device has equal priority to communicate, in which case the connectors 28 and 32 (shown in FIGS. 2B and 3A as being on opposite sides of the cradle body) would be electronically indistinguishable from one another. This specification is a common one for computer networks. With such a network the operator could daisy-chain two or more cradles together without regard for the identity of the connectors.

The network might take the form of a computer buss, such the Apple Computer Corporation's desktop buss for its Macintosh and Apple II computers. The "SCSI" ports of Apple and other desktop computers offer similar two-way communications capabilities at higher rates of data transmission. They could also be used to connect the controller/receiver cradles of the invention to computers.

As is the case for communications between the inventive meters and their cradles, there are many existing network or buss hardware standards and communication protocols which could be employed for communications between the inventive cradles and remote processors; many others could be established. No single or particular standard or protocol is a necessary or preferred element of any implementation of the invention, for many could work as well as the ones just described.

In other embodiments, the cradle of the invention includes no means for sending electric signals to a remote processor, but instead encloses a processor (such as a small dot-matrix printer for printing a strip chart or list of measured values received from a meter mounted in the cradle). Alternatively, the cradle can include its own batteries and a digital memory, so as to function as a combined data logger and carrying case which can be used in the field, and then connected to a processor upon return from the field.

Figure 6A:
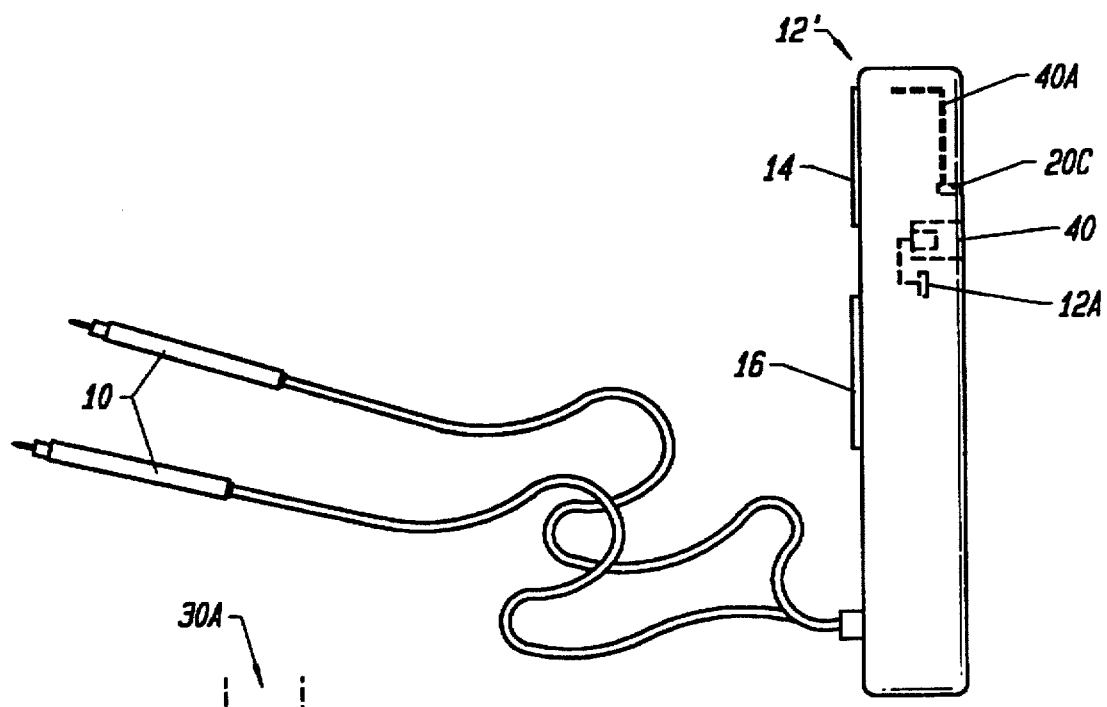
FIG. 6A is a side view of a meter having a port 20c for receiving radiation for illuminating its display 14.
Figure 6B:
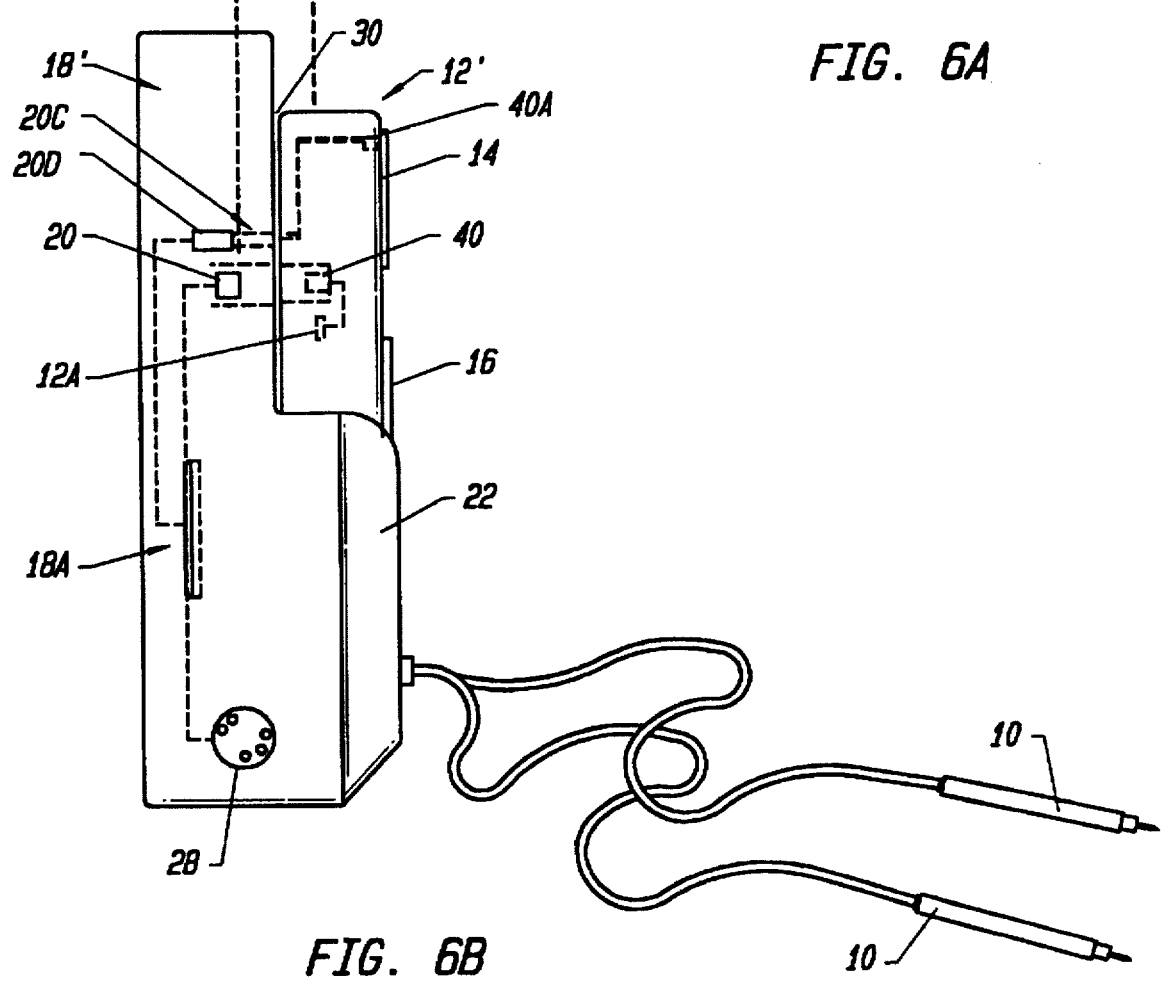
FIG. 6B is a side view of the meter of FIG. 6A mounted in a cradle, with port 20c of the meter aligned with illuminating radiation source 20d of the cradle.

Meter 12' shown in FIGS. 6A and 6B differs from meter 12 (shown in FIG. 2A) only in that it includes a port 20c for receiving illuminating radiation from an external radiation source, and an internal pathway 40a (such as a light pipe or optical fiber) for guiding illuminating radiation from port 20c to display 14. Cradle 18' shown in FIG. 6B differs from cradle 18 (shown in FIG. 2B) only in that it includes an illuminating radiation source 20d in addition to signal port 20. Port 20c of meter 12' is positioned so that when meter 12' is positioned in cradle 18', port 20c receives illuminating radiation emitted by source 20d.

Various modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. An apparatus for communicating by means of a wireless link, including:

a meter, including electrically conductive leads having first ends and second ends, circuitry connected to the first ends for generating data indicative of status of the leads when the second ends are in contact with an external object, and means for substantially continuously transmitting out of the meter signal-transporting radiation representing the data;

a cradle, shaped for removably constraining the meter in a cradled position with respect to the cradle; and a wireless interface means in the cradle for receiving the signal-transporting radiation from the meter when the meter is in said cradled position, said wireless interface means including means for transmitting radiation in wireless fashion to the meter when said meter is in said cradled position.

2. The apparatus of claim 1, wherein the signal-transporting radiation is a beam of infrared radiation.

3. The apparatus of claim 2, wherein the beam is modulated so as to transmit data representing meter measurements.

4. The apparatus of claim 1, wherein the signal-transporting radiation is a beam of visible radiation.

5. The apparatus of claim 1, wherein the signal-transporting radiation is a beam of ultraviolet radiation.

6. The apparatus of claim 1, wherein the means for transmitting radiation in wireless fashion transmits a beam of radiation modulated with control signals for controlling the meter.

7. The apparatus of claim 1, wherein the means for transmitting radiation in wireless fashion also includes:

means for transmitting light for illuminating at least a portion of the meter when the meter is in said cradled position.

8. The apparatus of claim 1, wherein the cradle has a pocket-like constraint portion dimensioned for surrounding a portion of the meter.

9. The apparatus of claim 1, wherein the cradle has a clasp-like shape, for supporting the meter in the cradled position when the meter is clasped to the cradle.

10. The apparatus of claim 1, wherein the wireless interface means includes:

an electrical port means; and electrical means connected to the electrical port means for converting said signal-transporting radiation received from the meter into electrical signals, and asserting the electrical signals to the electrical port means.

11. The apparatus of claim 10, wherein the wireless interface means includes a means for transmitting radiation modulated with control signals to the meter when the meter is in the cradled position, wherein the electrical port means receives electrical control signals, and wherein the electrical means converts said electrical control signals into said radiation modulated with control signals for transmission to the meter.

12. An apparatus for communicating with a meter by means of a wireless link, including:

a cradle, shaped for removably constraining the meter in a cradled position with respect to the cradle; and a wireless interface means in the cradle for receiving signal-transporting radiation from the meter when the meter is in said cradled position, wherein the meter has a display, and wherein the wireless interface means includes:

a means for illuminating at least a portion of the display with visible radiation when the meter is in said cradled position.

13. An apparatus for communicating with a meter by means of a wireless link, including:

a cradle, shaped for removably constraining the meter in a cradled position with respect to the cradle; and a wireless interface means in the cradle for receiving signal-transporting radiation from the meter when the meter is in said cradled position, wherein the wireless interface means includes a wireless means for transmitting radiation to the meter when the meter is in said cradled position, wherein the wireless means for transmitting radiation transmits a beam of radiation modulated with control signals for controlling the meter, and wherein the wireless means for transmitting radiation also transmits light for illuminating at least a portion of the meter when the meter is in said cradled position.

14. An apparatus for communicating with a meter by means of a wireless link, including:

a cradle, shaped for removably constraining the meter in a cradled position with respect to the cradle;

a wireless interface means in the cradle for receiving signal-transporting radiation from the meter when the meter is in said cradled position, wherein the wireless interface means includes a wireless means for transmitting radiation to the meter when the meter is in said cradled position, wherein the wireless means for transmitting radiation includes:

a means for transmitting a beam of radiation modulated with control signals for controlling the meter; and a lamp positioned for projecting visible illuminating radiation in a wireless manner on at least a portion of the meter when the meter is in said cradled position.

15. The apparatus of claim 14, wherein the beam of radiation is an infrared beam.

16. A meter apparatus, including:

a meter, including electrically conductive leads having first ends and second ends, circuitry connected to the first ends for generating data indicative of status of the leads when the second ends are in contact with an external object, and a signal port for transmitting out of the meter signal-transporting radiation representing the data, wherein the meter transmits the signal transporting radiation out of said meter substantially continuously, and without storing the data; and a cradle, having a wireless interface means including a second signal port, wherein the cradle removably constrains the meter in a cradled position in which the signal port is aligned with the second signal port, so that the second signal port receives the signal transporting data transmitted out of the signal port.

17. The apparatus of claim 16, wherein the meter is a multimeter.

18. The apparatus of claim 16, wherein the wireless interface means includes:

an electrical port means; and an electrical means, connected between the electrical port means and the second signal port, for converting signal-transporting radiation received at the second signal port from the signal port into electrical signals, and asserting the electrical signals to the electrical port means.

19. The apparatus of claim 18, wherein the second signal port transmits radiation to the signal port.

20. The apparatus of claim 19, wherein the electrical port means receives electrical control signals from a remote source, wherein the electrical means converts said electrical control signals into radiation modulated with control signals, and wherein the second signal port transmits said radiation modulated with control signals to the signal port.

21. The apparatus of claim 19, wherein the electrical means produces radiation modulated with control signals, and wherein the second signal port transmits said radiation modulated with control signals to the signal port.

22. The apparatus of claim 18, also including:

an electrical connector having a first end connected to the electrical port means and a second end; and a processor connected to the second end of the electrical connector for receiving and processing the electrical signals.

23. The apparatus of claim 22, wherein the processor sends electrical control signals through the electrical connector to the electrical port means, and wherein the electrical means converts said electrical control signals into radiation modulated with control signals for transmission from the second signal port to the signal port.

24. The apparatus of claim 16, wherein the wireless interface means includes:
 a first electrical port means and a second electrical port means; and
 an electrical means, connected between the first electrical port means, the second electrical port means, and the second signal port, for converting signal-transporting radiation received at the second signal port from the signal port into electrical signals, and asserting the electrical signals to at least one of the first electrical port means and the second electrical port means.

25. The apparatus of claim 24, also including:
 a second cradle electrically connected to the first electrical port means, wherein the second cradle has a wireless interface means and is dimensioned for constraining a second meter in a cradled position.

26. The apparatus of claim 25, also including:
 a third cradle electrically connected to the second electrical port means, wherein the third cradle has a wireless interface means and is dimensioned for constraining a third meter in a cradled position.

27. The apparatus of claim 24, also including:
 a processor electrically connected to the first electrical port means.

28. The apparatus of claim 27, also including:
 a second cradle electrically connected to the second electrical port means, wherein the second cradle has a wireless interface means and is dimensioned for constraining a second meter in a cradled position.

29. A meter apparatus, including:
 a meter, including electrically conductive leads having first ends and Second ends, circuitry connected to the first ends for generating data indicative of status of the leads when the second ends are in contact with an external object, and a signal port for transmitting signal-transporting radiation representing the data; and
 a cradle, having a wireless interface means including a second signal port, wherein the cradle removably constrains the meter in a cradled position in which the signal port is aligned with the second signal port, wherein the wireless interface means includes:
 an electrical port means; and
 an electrical means, connected between the electrical port means and the second signal port, for converting signal-transporting radiation received at the second signal port from the signal port into electrical signals, and asserting the electrical signals to the electrical port means, wherein the second signal port transmits radiation to the signal port, wherein the electrical port means receives electrical control signals from a remote source, wherein the electrical means converts said electrical control signals into radiation modulated with control signals, and wherein the second signal port transmits said radiation modulated with control signals to the signal port, wherein the cradle also includes wireless means for transmitting visible radiation for illuminating at least a portion of the meter.

30. The apparatus of claim 29, wherein the wireless means for transmitting visible radiation transmits said visible radiation through the second signal port.

31. The apparatus of claim 29, wherein the meter includes an illuminating radiation port, and wherein the wireless means for transmitting visible radiation transmits the visible radiation through the illuminating radiation port.

32. The apparatus of claim 29, wherein the wireless means for transmitting visible radiation includes a lamp, separate from the second signal port, for projecting said visible radiation on at least a portion of the meter.

33. A meter apparatus, including:
 a meter, including electrically conductive leads having first ends and second ends, circuitry connected to the first ends for generating data indicative of status of the leads when the second ends are in contact with an external object, and a signal port for transmitting signal-transporting radiation representing the data; and
 a cradle, having a wireless interface means including a second signal port, wherein the cradle removably constrains the meter in a cradled position in which the signal port is aligned with the second signal port, wherein the wireless interface means includes:
 an electrical port means; and
 an electrical means, connected between the electrical port means and the second signal port, for converting signal-transporting radiation received at the second signal port from the signal port into electrical signals, and asserting the electrical signals to the electrical port means, wherein the second signal port transmits radiation to the signal port, wherein the electrical means produces radiation modulated with control signals, and wherein the second signal port transmits said radiation modulated with control signals to the signal port, and wherein the cradle also includes wireless means for transmitting visible radiation for illuminating at least a portion of the meter.

34. The apparatus of claim 33, wherein the wireless means for transmitting visible radiation transmits said visible radiation through the second signal port.

35. The apparatus of claim 33, wherein the wireless means for transmitting visible radiation includes a lamp, separate from the second signal port, for projecting said visible radiation on at least a portion of the meter.

36. A meter apparatus, including:
 a meter, including electrically conductive leads having first ends and second ends, circuitry connected to the first ends for generating data indicative of status of the leads when the second ends are in contact with an external object, and a signal port for transmitting signal-transporting radiation representing the data; and
 a cradle, having a wireless interface means including a second signal port, wherein the cradle removably constrains the meter in a cradled position in which the signal port is aligned with the second signal port, wherein the cradle includes a wireless radiation source for emitting illuminating radiation, and wherein the meter includes:
 a display;
 a receiving port for receiving at least a portion of the illuminating radiation when the meter is in said cradled position; and
 an internal pathway between the receiving port and the display for guiding the received illuminating radiation from the receiving port to the display.

37. A meter, including:

means for generating electronic signals indicative of meter data; and signal port means for receiving an unmodulated radiation beam, modulating the unmodulated radiation beam in response to the electronic signals to produce signal-transporting radiation, wherein changes in the signal-transporting radiation with time are indicative of the meter data, and directing the signal-transporting radiation from the meter through the signal port means.

38. The meter of claim 37, wherein the meter data include control parameters.

39. The meter of claim 37, wherein the meter data are indicative of at least one meter reading.

40. A meter, including:

means for generating electronic signals indicative of meter data; and signal port means for transmitting a signal-transporting radiation beam in response to said electronic signals, wherein the signal-transporting radiation beam radiates more than half its power within a half angle of no more than ten degrees.

41. The meter of claim 40, wherein the meter data include control parameters.

42. The meter of claim 40, wherein the meter data are indicative of at least one meter reading.

43. A meter, including:

means for generating electronic signals indicative of meter data; and signal port means for radiating a signal-transporting radiation beam in response to said electronic signals, wherein the meter has no mode of operation in which it radiates power from said signal port means in excess of 10 milliwatts, on a time-averaged basis.

44. The meter of claim 43, wherein the meter data include control parameters.

45. The meter of claim 43, wherein the meter data are indicative of at least one meter reading.

46. A meter, including:

electrically conductive leads having first ends and second ends;

circuitry connected to the first ends for generating data indicative of status of the leads when the second ends are in contact with an external object;

a display for displaying a representation of said data;

a wireless receiving port for receiving illuminating radiation; and an internal pathway between the wireless receiving port and the display for guiding the received illuminating radiation from the wireless receiving port to the display, to illuminate the display.

47. A meter, including:

a display;

a wireless receiving port for receiving illuminating radiation;

an internal pathway between the wireless receiving port and the display for guiding the received illuminating radiation from the wireless receiving port to the display, to illuminate the display;

means for generating electronic signals indicative of meter data; and signal port means for transmitting a signal-transporting radiation beam in response to said electronic signals, wherein the signal-transporting radiation beam radiates more than half its power within a half angle of no more than ten degrees.

48. An apparatus for communicating by means of a wireless link, including:

a meter, including electrically conductive leads having first ends and second ends, circuitry connected to the first ends for generating data indicative of status of the leads when the second ends are in contact with an external object, and means for substantially continuously transmitting out of the meter signal-transporting radiation representing the data;

a cradle, shaped for removably constraining the meter in a cradled position with respect to the cradle;

a wireless interface means in the cradle for receiving the signal-transporting radiation from the meter when the meter is in said cradled position; and a signal storage means in the cradle for storing data determined by the signal-transporting radiation received from the meter.

49. A meter system, including:

means for generating an unmodulated radiation beam;

a meter, including a means for generating electronic signals indicative of meter data, and signal port means for receiving the unmodulated radiation beam, modulating the unmodulated radiation beam in response to the electronic signals to produce signal-transporting radiation, and directing the signal-transporting radiation from the meter through the signal port means; and means for releasably holding the meter in close proximity to the means for generating the unmodulated radiation beam, in such a position that the unmodulated radiation beam is incident on the signal port means.

* * * * *

UNITED STATES PATENT AND TRADEMARK OFFICE
CERTIFICATE OF CORRECTION

PATENT NO. : 5,640,155
DATED : June 17, 1997
INVENTOR(S) : Charles T. Springer

It is certified that error appears in the above-indentified patent and that said Letters Patent is hereby corrected as shown below:

In column 2, line 35, delete "Exteck" and insert --Extech--;

In column 2, line 58, delete "5";

In column 3, lines 26-27, delete "The above-mentioned Exteck Instruments Corporation" and insert --A conventional port-equipped--;

In column 6, line 15, delete "other";

In column 7, line 12, delete "a" and insert --at--;

In column 9, line 18, delete "constrains" and insert --constrain--;

In column 10, line 21, delete "12" and insert --12'--;

In column 10, line 22, delete "18" and insert --18'--;

In column 10, line 23, delete "18" and insert --18'--;

In column 10, line 42, delete "laptop";

In column 12, line 34, delete "one or more meters" and insert --a meter--; and

In column 19, line 42, delete "Second" and insert --second--.

Signed and Sealed this

Twenty-third Day of September, 1997

Attest:

BRUCE LEHMAN

Attesting Officer

Commissioner of Patents and Trademarks